United States Patent [19]

Huie et al.

[11] Patent Number: 4,914,051
[45] Date of Patent: Apr. 3, 1990

[54] METHOD FOR MAKING A VERTICAL POWER DMOS TRANSISTOR WITH SMALL SIGNAL BIPOLAR TRANSISTORS

[75] Inventors: Wing K. Huie, North Wales, Pa.; Alexander H. Owens, Pennington, N.J.; David S. Pan, Doylestown, Pa.; Michael J. Zunino, Spencer, Mass.

[73] Assignee: Sprague Electric Company, North Adams, Mass.

[21] Appl. No.: 281,593

[22] Filed: Dec. 9, 1988

[51] Int. Cl.$^4$ .................... H01L 21/20; H01L 21/302
[52] U.S. Cl. ......................................... 437/59; 437/29; 437/31; 437/40; 437/41; 437/61; 148/DIG. 126; 357/23.4
[58] Field of Search ................... 357/23.4, 40, 41, 43; 437/26, 27, 29, 30, 31, 40, 41, 56, 57; 148/DIG. 126

[56] References Cited

U.S. PATENT DOCUMENTS

| | | | |
|---|---|---|---|
| 4,325,180 | 4/1982 | Curran | 357/23.4 |
| 4,402,003 | 8/1983 | Blanchard | 357/43 |
| 4,403,395 | 9/1983 | Curran | 29/571 |
| 4,628,341 | 12/1986 | Thomas | 357/42 |
| 4,814,288 | 3/1989 | Kimura et al. | 437/31 |

OTHER PUBLICATIONS

Amato, Michael and Vladimir Rumennik, "Comparison of Lateral and Vertical DMOS Specific On-Resistance", IEDM 85, pp. 736-739.

*Primary Examiner*—Brian Hearn
*Assistant Examiner*—T. Thomas

[57] ABSTRACT

A silicon integrated circuit includes a vertical power DMOS transistor and a vertical NPN transistor in separate epitaxial pockets by a method including simultaneously forming a plurality of D-well regions in the DMOS transistor and the base region in the NPN transistor, and including simultaneously forming the elemental source regions and the emitter region. N-type buried layers are provided simultaneously in the DMOS and the NPN transistors, respectively. Also formed simultaneously are two N+ plugs connecting the two buried layers, respectively, to the epitaxial surface of the integrated circuit die. None of these economically attractive simultaneous steps requires deviation in either device from optimum geometries. Also disclosed are compatible and integrated steps for forming small signal CMOS transistors. This method also includes a full self-alignment of gate, source and channel regions in the DMOS transistor as well as in the CMOS transistors.

8 Claims, 3 Drawing Sheets

METHOD FOR MAKING A VERTICAL POWER DMOS TRANSISTOR WITH SMALL SIGNAL BIPOLAR TRANSISTORS

BACKGROUND OF THE INVENTION

This invention relates to an integrated circuit having a high-power DMOS transistor integrated with low-power small-signal-handling bipolar and CMOS transistors.

It is well known to integrate small-signal low-power transistors with a large-power-handling transistor. Only recently have lateral DMOS transistors and small-signal-handling bipolar transistors been integrated.

The load current in a lateral DMOS transistor flows "horizontally" in the channel and drift region to the drain contact, i.e. in a direction parallel to the major outer surface of the integrated circuit die and is capable of operational high drain to source voltages, e.g. over 500 volts. Lateral DMOS transistors are readily integrated since its structural parts are all located close to the surface of the die. Also, voltage breakdown occurs at the highest voltage gradient point in the lightly doped portion of the drain, typically an epitaxial layer portion of an integrated circuit, and since the voltage gradient is itself horizontal, the epitaxial layer thickness need not be abnormally thick, so that the difficulties of forming deep diffusions for isolation walls and plugs are greatly ameliorated.

It has been suggested that for integrating a lateral NPN transistor with a lateral DMOS transistor the base and D-well may be formed simultaneously, but compromising the performance of the lateral NPN transistor because the optimum P-dopant concentrations for the base and D-well are not the same.

However, such a lateral DMOS power transistor, when integrated with a vertical NPN transistor, is made by forming the NPN base in a separate step prior to forming the D-well of the DMOS transistor because the base width in the vertical NPN must be kept small (in the vertical direction) to maintain high gain whereas the corresponding vertical distance between the source and the bottom of the D-well in the lateral DMOS transistor must be substantially thicker to avoid voltage breakdown due to punch-through degrading the high voltage capability for which the lateral DMOS transistor is best suited.

The current-carrying capability of a lateral DMOS transistor is limited, especially by the relatively high resistance of the long epitaxial portion of the drain that is required to support the high drain voltage.

Vertical DMOS transistors are known to provide better current-carrying capability and at the same time can sustain moderately high voltages, e.g. 100 volts. Vertical DMOS transistors are more suitable for driving solenoid motors and other high current loads. However, the integration of a vertical DMOS transistor is more difficult. The epitaxial layer must be thick enough that breakdown due to punch-through in the epitaxial portion of the drain between the D-well and N+ buried layer must have a very low resistance connection to a contact region at the epitaxial outer surface via an extensive N+ plug. These are two rather incompatible requirements that imply compromises in die size and severe limitations respecting the possible sequences process steps.

It is an object of this invention to provide an improved method for making a vertical DMOS transistor of high current carrying capability integrated with small signal vertical NPN transistors.

It is a further object of this invention to provide such an integrated circuit made by a method that is efficient with respect to the number of steps required.

It is a further object of this invention to provide such an integrated vertical DMOS transistor that has self-aligned gate, channel and source regions.

It is a further object of this invention to provide such an integrated circuit additionally including small signal CMOS transistors.

SUMMARY OF THE INVENTION

A method for making an integrated circuit combines in a silicon die a high current carrying vertical DMOS transistor in a first epitaxial pocket and a small signal vertical NPN transistor in a second epitaxial pocket, and includes simultaneously forming a plurality of spaced-apart free-standing D-well regions in said first pocket and a base region in said second pocket; forming simultaneously an elemental source region in each of said D-well regions and an emitter in said base region: simultaneously forming two heavily doped buried layers of the same polarity-type as that of said emitter and source regions in said first pocket and second pocket, respectively; and forming simultaneously two plug regions of said polarity-type extending through said pockets, respectively, from said buried layers to an outer epitaxial surface of said die.

A significant feature of this invention lies in the technique for preserving self-alignment of source gate and channel in the vertical DMOS transistor while simultaneously determining the characteristics of the vertical NPN transistor. The bulk channel region of the DMOS transistor, the D-well, is formed by the same steps that form the base of the NPN transistor and those steps determine the dopant profile in both the D-well and the base of the vertical NPN transistor. Thus NPN base width and current gain are determined for a given emitter geometry while the DMOS channel length and threshold are determined for a given self-aligned source geometry.

This invention recognizes that in a lateral NPN transistor the base width determining transistor gain is the lateral distance between the emitter and the base-collector junction, but in a vertical NPN transistor, the base width is the vertical distance in the base region between the emitter and base-collector junction, and that NPN transistor current gain is inversely related to base width. Thus the base width of the vertical NPN transistor may be determined in the method of this invention by the desired performance in the NPN without compromising the geometry and performance of the DMOS transistor since that vertical distance in a D-well between source and the epitaxial drain-junction is not critical to the performance of a vertical DMOS transistor with the commonly connected source and D-well regions. Thus formation of the source and D-well of the DMOS transistor may be formed simultaneously, respectively, with the emitter and base of the NPN transistor providing a simple integrated low cost process without the need to compromise geometries of either device.

In another aspect of this invention the integrated vertical DMOS transistor has the D-well spaced away from the P+ isolation wall by N-epitaxial pocket material and has a P-type back-gate contact region (D-well contact region) formed wholly within a portion of the D-well and directly adjacent to the N+ source region so that source metal conductors may make ohmic contact to both the back-gate contact region and the source, while being electrically separate from the P+ isolation walls and the P-substrate of the integrated circuit. This feature is essential when two or four DMOS power transistors are used, respectively, in a half wave or a full wave motor driven circuit which require at least one driver transistor to operate at a level that is entirely above ground level.

DESCRIPTION OF THE PREFERRED EMBODIMENTS

Figure 1:
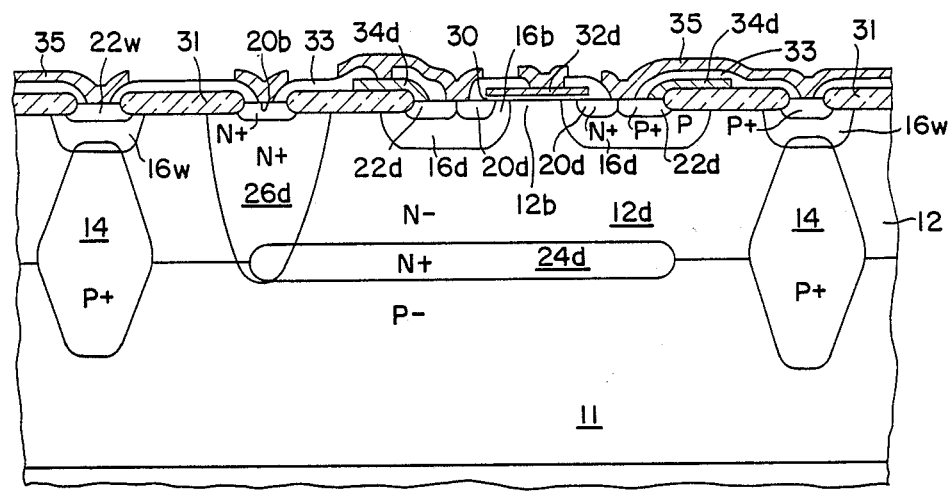
FIG. 1 shows in side sectional view a portion of an integrated circuit of this invention containing a vertical DMOS transistor taken in plane 1—1 as defined in FIG. 2.
Figure 2:
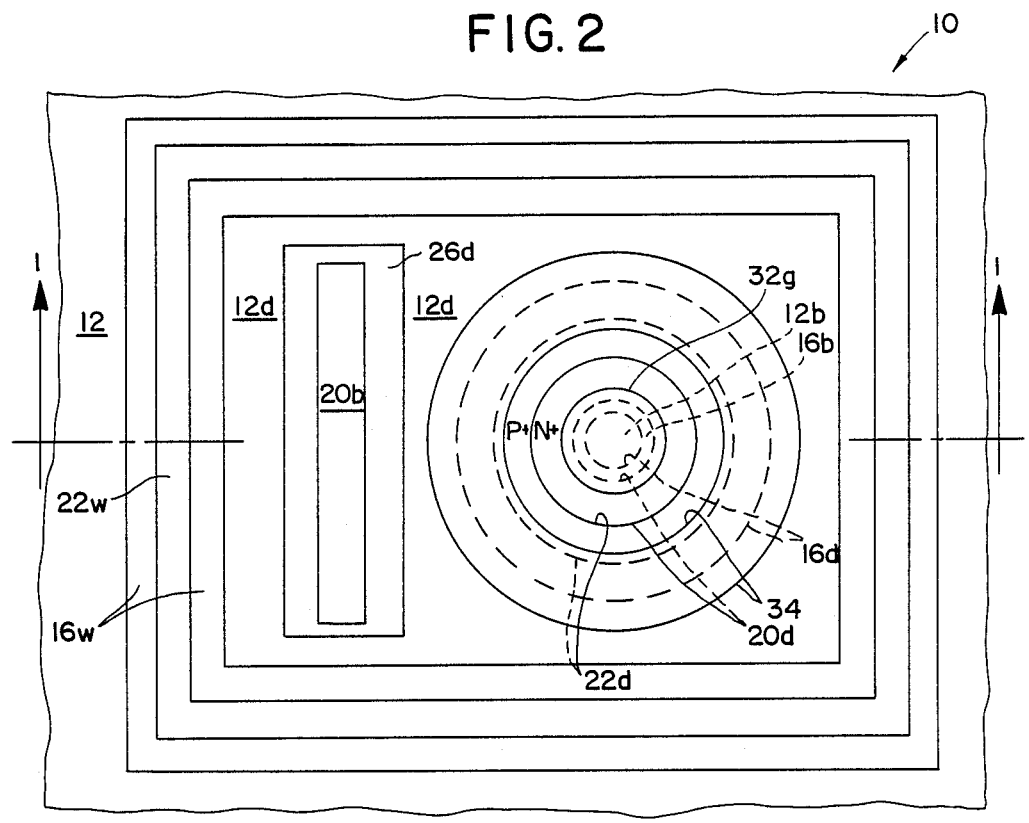
FIG. 2 shows in top view the portion of the integrated circuit of FIG. 1 with the phosphorous silicate glass and the field oxide considered transparent, i.e. dashed lines exclusively indicate doped silicon region boundaries underlying the polysilicon gate or boundaries of the gate and the field plate. Also, the metal shown in FIG. 1 is removed as seen in FIG. 2.

Referring to FIG. 1 a vertical DMOS transistor is formed in a portion 10 of a silicon die having a P-substrate portion 11 and an N-epitaxial layer 12 grown on one major face thereof. The DMOS transistor is formed in epitaxial pocket 12d encompassed by the P-substrate 11 and the P+ isolation walls formed by a composite of annular boron doped regions 14 and 16w. The P+ region 14 is up-diffused during and after epitaxy, and subsequently the P region 16w is formed simultaneously with the bulk channel region 16d. The P-diffused bulk channel region 16d, hereinafter referred to as the D-well, has an annular configuration as is seen in FIG. 2, and is spaced away from the isolation wall 14/16w.

As seen in the side sectional view of FIG. 1, there are shown two spaced apart segments of the D-well 16d, one to the left and one to the right. The unseen portions of the D-well electrically connect the two segments to each other. Likewise each D-well segment has built into it an elemental N-type source region that is electrically connected together by the remainder of the annular source region 20. The significance of these particular constructions will become clear in the description herein of another preferred embodiment illustrated in FIG. 5 and 6.

Within the annular D-well 16d there is formed an annular N+ source 20d. An annular P+ contact region 22d in the D-well 16d also has an annular shape and is positioned at and is abutting the outer periphery of the annular N+source 20d. An N+ buried layer 24d is formed at the interface between epitaxial pocket 12d and the substrate 11. An N+ buried layer 24d extends through the N-epitaxial layer to the N+ plug 26d, serving as the drain contact of the DMOS transistor. A gate-oxide 30 supports a polysilicon gate 32d. A relatively thick field oxide 31 has been selectively grown by the standard LOCOS process on surface portions of the silicon die 10. An annular polysilicon field plate 34d overlies and inhibits inversion of the outer periphery of the annular D-well 16d.

Thus, the vertical DMOS channel region is that inner peripheral or channel portion 16b of the annular D-well 16 bounded at the die surface by the source 20d and the epitaxial surface region 12p. That region 12p within the aperture of the annular D-well 16d is a pinch depletion region when the DMOS transistor is turned off. A boron phosphorous silicate glass 33 overlies selected portions of the field oxide 31, the gate 32d and the field plate 33. Drain current flows vertically between that aperture in the D-well 16d and the buried layer 24d, which buried layer serves as a low resistance part of the drain and is electrically accessible via N+ plug 26. The drain is thus composed of the plug 26, the buried layer 24d and the N-epitaxial pocket material 12d.

Figure 3:
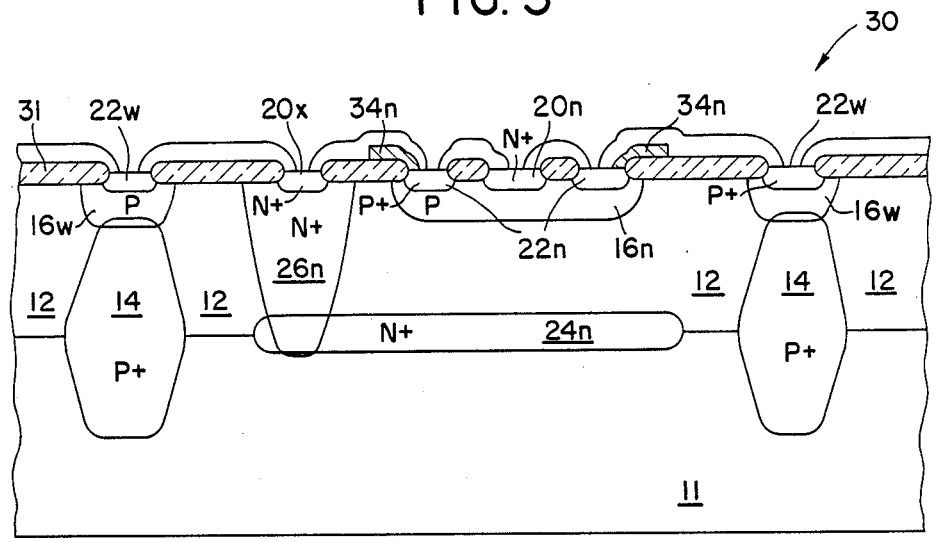
FIG. 3 shows in a side sectional view a vertical NPN transistor in another portion of the integrated circuit in which the DMOS transistor of FIGS. 1 and 2 is formed.
Figure 4:
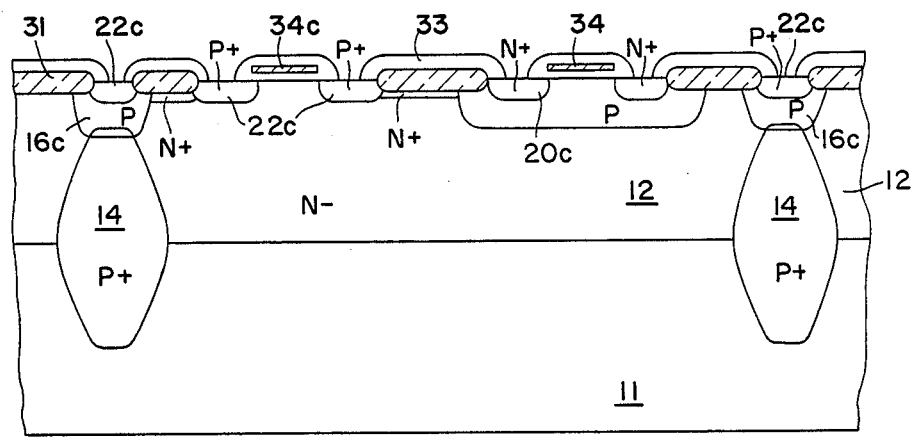
FIG. 4 shows in side sectional view a pair of CMOS transistors in yet another portion of the integrated circuit in which the DMOS transistor of FIG. 1 and the NPN transistor of FIG. 3 are formed.

Referring now to FIG. 3, a vertical NPN transistor is formed in a portion 30 of the integrated circuit die wherein the P-base 16n was formed simultaneously with the annular D-well 16d of the DMOS transistor and so has the same vertical P-type (boron) dopant profile and the same depth. Likewise, the annular N+ source 20d and the NPN emitter 20n were simultaneously formed and have the same conductivity profile and depth. This P-base diffusion in the NPN transistor determines the base width which in turn determines the current gain of this transistor as well as the punch through voltage $V_{CEO}$ of the NPN transistor. However, in the vertical DMOS transistor 10, the potential parasitic NPN transistor formed of regions 20b (emitter), 16b (base) and 12d (collector) is deactivated by providing a source metal 35 at the opening in glass 33 and contacting the isolation-wall P+ contact region 22w. The metal contacts both the N+ source region 20d and P-region 16d and effectively shorts the parasitic NPN in the DMOS transistor emitter to base.

Also, the thinner the NPN base width becomes, i.e. the vertical distance between base-emitter junction and collector-base junction, the higher the NPN current gain tends to become. In a lateral DMOS transistor, voltage breakdown is an avalanche breakdown voltage occurring when a lateral voltage gradient reaches a critical value in the epitaxial pocket 12a. The source and D-well are shorted in the vertical DMOS transistor and voltage breakdown is caused by punch-through in the epitaxial portion of the drain. Thus the base width of the NPN may be determined entirely by the wanted performance in the NPN without compromising those of the vertical DMOS transistor.

The P-type dopant concentration in base 16n and D-well 16d affects the gain of the NPN and the threshold voltage of the DMOS transistor. With a resistivity of 1200 ohms per square in both, and a base width of 2.8 microns, a particular integrated circuit of this invention has an NPN gain ($\beta$) of between 50 and 100. The $BV_{CEO}$ of the NPN is 25 volts. The DMOS threshold voltage is 1.4 volts and nominal source to drain voltage is 65 volts. The NPN transistors were used as analogue signal amplifying circuits, especially operational amplifiers. The DMOS transistor threshold voltage is achieved without a threshold adjust implantation step and is determined solely at the one boron implantation and subsequent drive steps that simultaneously form the base and D-well. The DMOS breakdown voltage exceeds 80 volts.

Starting with a P-type silicon wafer having a major face in the 100 plane, an N-type epitaxial layer of about 10 microns thickness and having 2 ohm-cm volume resistivity is grown over the wafer surface including P+ and N+ buried layers at the wafer-epitaxial layer interface by standard masking, pre-deposition, driving and epitaxial growth steps, all well known in the art. The P+ buried layers are situated where the P+ isolation walls are to be, and become the up-diffused portions of those isolation walls. The N+ buried layers are situated at the bottoms of the epitaxial pockets that are the sites, respectively, of the vertical NPN transistor and the DMOS transistor.

Next, the N+ plug regions are formed, respectively, in the NPN and DMOS epitaxial pockets. In each case, the N+ plug extends from the outer epitaxial surface to the corresponding of the N+ buried layers.

After stripping the oxide formed at the standard heating step for driving the N+ plugs, a high quality oxide of 1000 angstroms is grown over the epitaxial layer and over this oxide is deposited a 5000 angstrom thick polysilicon layer. A photoresist masking layer is formed covering only this first polysilicon layer and the overlying oxide layer at regions at which the DMOS gate will be located. The polysilicon and oxide is then removed by etching in the adjacent exposed areas forming the DMOS gate.

Another photoresist mask is made for selectively implanting boron in areas, respectively, to become the D-well and the base of the NPN transistor. An opening in this mask exposes the entire DMOS transistor device area including the already formed gate. Thus the photoresist mask defines the NPN base region, and the polysilicon DMOS gate in conjunction with the photoresist mask defines the areas that are to receive the boron dose that will locate the D-well self aligned with the gate.

After stripping the D-well and base mask, a new photoresist mask is formed for selectively implanting boron impurities in the region to become the P-well of the N-channel transistor in the CMOS epitaxial pocket.

Then the P-well mask is removed and the wafer is heated to 1210° C. for 70 minutes to drive both the NPN base region and the D-well to a depth of 3.3 microns and to drive the P-well to about 3 microns. This deeper D-well is effected in the same heating step by the greater implanted dose there. This combination of boron doses and common drive is aimed at providing the same 1.4 volts threshold voltage for both the N-MOS and DMOS transistors, accounting for the planned thinner gate oxide in the N-MOS transistor is further discussed below.

The next series of steps is for providing an N+ field guard ring about the P-channel device and for growing a thick field oxide of about 12,000 angstroms around the DMOS, NPN and CMOS transistors. Included are a blanket deposition of silicon nitride, masking, selective removal of nitride outside the device areas, removing the old and forming a new photoresist mask, implantation of phosphorous to form the N+ guard ring of the P-MOS transistor and heating to grow the thick field oxide about the devices and simultaneously drive the phosphorous.

After stripping the nitride mask remaining from the above described LOCOS procedure, a high quality gate oxide of 550 angstroms thickness is grown over the wafer followed by the deposition of a blanket layer of a second layer of polysilicon. This second polysilicon layer is 5000 angstroms thick and a portion of it will become a resistor. Then a silicon dioxide layer is grown over the second polysilicon layer. A blanket phosphorous implant is effected through the oxide layer into the blanket polysilicon layer to determine the conductivity of the resistor. This resistor area is chosen to lie over the thick field oxide.

A photoresist mask is prepared exclusively overlying an area of the oxide-covered second polysilicon layer at which a polysilicon resistor is to be developed. The oxide overlying the second polysilicon is then removed everywhere except over the resistor. A standard POCl doping of the exposed (not oxide coated) polysilicon is then performed to achieve a surface resistivity of about 20 ohms per square. The oxide is then stripped from the polysilicon.

A new photoresist mask is prepared having openings through which portions of the second polysilicon layer may be etched and removed to form circular field plates around the NPN and D-MOS transistors and the gates of the C-MOS transistors.

After reoxidizing the surface of the remaining of the second polysilicon layer, namely the resistor, all gates and the polysilicon field plates, an apertured photoresist mask is formed and phosphorous is selectively implanted through these apertures and the oxide to initiate formation of the NPN emitter, the sources of the DMOS and NMOS transistors and N+ surface contact regions in the N+ plugs. Also, the polysilicon gate of the DMOS transistor is doped in this step. Apertures of this mask overlie opposite edges of the first and second-polysilicon layer of which the gates of the DMOS and NMOS transistors respectively are made so that this phosphorous implantation initiates self-aligned formation of the source of the DMOS transistor and the source and drain of the N-MOS transistor with the gates of those respective transistors. The N+ mask is then removed.

A P+ mask is formed having apertures through which boron is implanted to initiate formation of self-aligned source and drain of the P-MOS transistor, the D-well back contact region, the surface contact portion of the isolation wall, and the base contact region of the NPN transistor.

The P+ mask is removed, a layer 7500 angstroms thick of BPSG (boron phosphorous silicate glass) is deposited by a standard CVD (chemical vapor deposition) step and the glass reflowed in a standard mild heating step. Holes are formed in the reflowed BPSG coating by conventional mask and etch steps and after removal of the mask, a blanket one micron layer of aluminum is deposited. A new mask is formed over this first metal layer and after etching through openings in the mask a first system of metal conductors is formed, to make connections to all of the transistors and the resistor.

A blanket coating of polyimide resin is put down over which there is formed a photoresist mask in which apertures correspond to vias in the polyimide that are etched through. After mask removal, a heavy 2.5 micron layer of aluminum, the second metal layer, is then vacuum deposited. A new photoresist mask is formed and portions of the second metal layer are etched away leaving a system of metal circuit conductors that make contact to the first metal only. This is followed by a standard polyimide passivation and removal of portions of the passivation at which bonding pad portions of the first and second metal conductor systems are made accessible.

Figure 5:
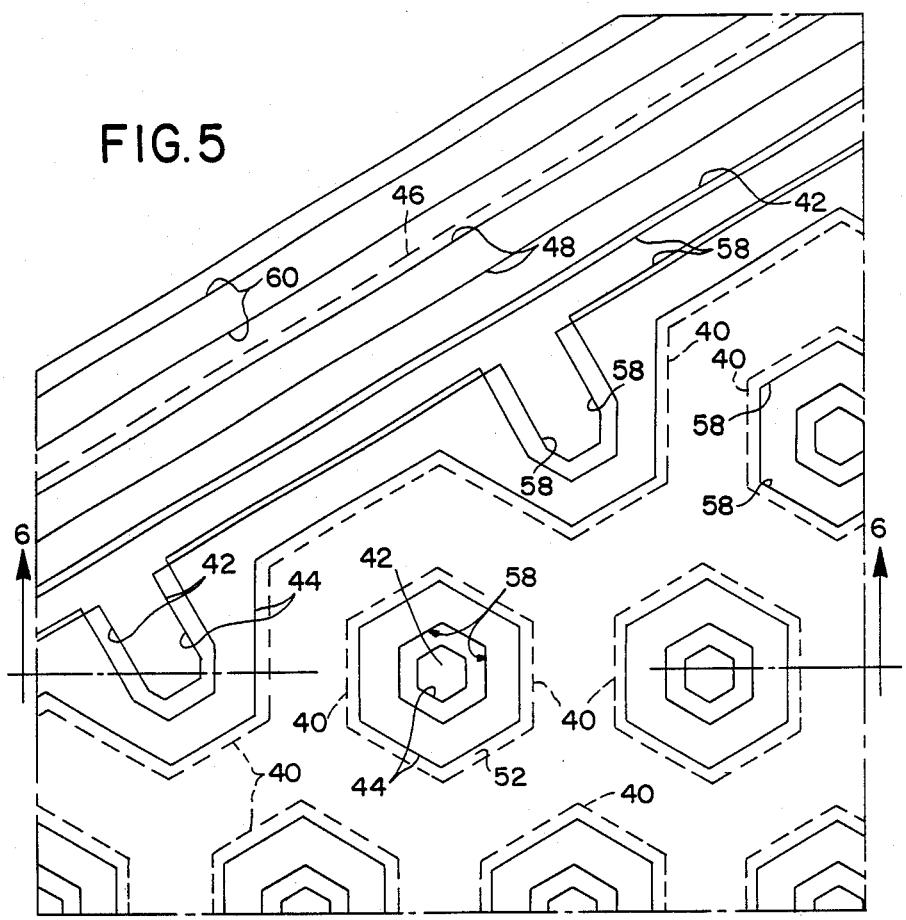
FIG. 5 shows in top view a portion of another integrated circuit of this invention excluding the source-regions-contacting metal layer, which portion includes part of a multiple-sources power-DMOS transistor of this invention.
Figure 6:
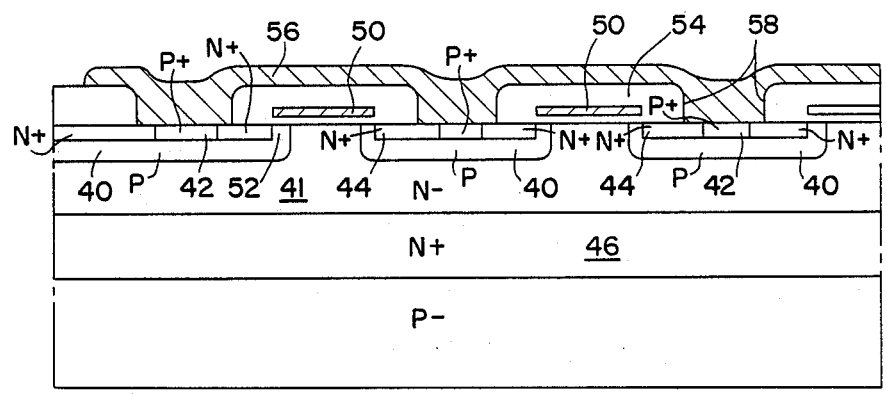
FIG. 6 shows in side sectional view the die portion in FIG. 5 taken in plane 6—6 including the source-regions-contacting metal layer 60.

The second preferred embodiment illustrated in FIGS. 5 and 6 includes a vertical DMOS transistor having a plurality of P-type D-wells 40 formed in the N-epitaxial pocket 41 that are spaced equally apart and that are arranged in a regular array pattern. Each D-well 40 has a P+ contact region 42.

Each D-well 40 also has an elemental N+ source region 44 formed about the P+ contact region 42. The N+ buried layer 46 is contacted by an annular N+ plug 48 that surrounds all of the elementary island D-well regions 40. The polysilicon gate 50 is a contiguous sheet covering all areas between all adjacent pairs of D-well regions 40. This polysilicon gate sheet 50 is used as a mask for both implanting boron to form the D-wells 40 and for implanting arsenic to form the elemental source regions 44. The boron of the D-wells 40 has diffused at the heating drive step to extend slightly under the edges of the gate 50, which extension forms the DMOS channel regions 52.

A boron phosphorous silicate glass 54 is deposited over the gate 50 and the first metal layer 56 is deposited over the glass 54 contacting, through holes 58 provided in the oxide, both the elemental source regions 44 and the D-well contact regions 42. A P+ isolation wall 60 surrounds the annular N+ plug 48 defining the epitaxial pocket 41, providing a low resistivity drain connection in the silicon.

What is claimed is:

1. The method for making an integrated circuit combining in a silicon die a high current carrying vertical DMOS transistor in a first epitaxial pocket and a small signal vertical NPN transistor in a second epitaxial pocket, including forming isolation walls to define said pockets; simultaneously forming a plurality of spaced apart free-standing D-well regions in said first pocket and a base region in said second pocket; forming simultaneously an elemental source region in each of said D-well regions and an emitter in said base region; simultaneously forming two heavily doped buried layers of the same polarity-type as that of said emitter and source regions in said first pocket and second pocket, respectively; forming simultaneously two plug regions extending through said pockets, respectively, from said buried layers to an outer epitaxial surface of said die;

forming a glass layer over said surface, said glass layer having one hole positioned over a portion of each of said elemental DMOS source regions and a hole over said isolation wall and extending over an adjacent portion of the corresponding D-well region;

forming a metal conductor over said glass layer and through said one holes and through said isolation-wall hole to make shorting ohmic contacts between said each elemental source and corresponding D-well region and to electrically connect said source regions to each other and to said isolation wall, said metal conductor serving as the single source contact of said DMOS transistor;

forming another hole in said glass layer over said DMOS plug region in said first pocket and forming another conductor over said glass layer that is spaced away from said metal conductor and that makes ohmic contact with said DMOS plug region to serve as the drain contact of said DMOS transistor.

2. The method of claim 1 wherein said plurality of D-well regions are each islands regularly spaced in an array pattern to provide the same distance between each adjacent pair of said D-well regions.

3. The method of claim 1 wherein said plug region in said first pocket is an annular region completely surrounding said plurality of D-well regions.

4. The method of claim 3 wherein said first pocket said annular plug region has an annular region of contact with said buried layer to define within said first epitaxial pocket a sub-epitaxial pocket in which said D-wells are formed.

5. The method of claim 1 additionally comprising forming a gate insulating layer, depositing a first blanket polysilicon gate-insulating layer, removing a portion of said layer to form a plurality of polysilicon patches in areas respectively lying over each space between the adjacent of said D-well regions, and electrically connecting said patches to each other to serve as the gate of said DMOS transistor.

6. The method of claim 5 additionally comprising developing in a third of said epitaxial pockets a pair of CMOS transistors; and additionally comprising growing by a standard LOCOS process a thick silicon dioxide field oxide layer at said surface over areas surrounding each of said DMOS, NPN and CMOS transistors; and in a second polysilicon deposition step forming a pattern of polysilicon to form the gates of said CMOS transistors and to form field plates over said thick oxide layer surrounding said CMOS and DMOS transistors serving as polarity-inversion-inhibiting field plates thereabout.

7. The method of claim 5 wherein said forming of said NPN base region and said D-well regions is accomplished after forming said polysilicon gate-patches and includes ion implanting P-type impurities and heating to partially drive said P-type impurities, and said forming of said DMOS source regions and said emitter region are also accomplished after forming said gate by ion implanting N-type impurities, said providing said NPN and DMOS transistors including simultaneously heating to drive both said fast P- and N-type impurities to completely form said base, emitter, D-wells and elemental DMOS source regions.

8. The method of claim 7 wherein said polysilicon patches are employed as a mask both during said ion implanting said P-type D-well regions and during said ion implanting said source regions to provide self-alignment between each of said gate-patches and the immediately adjacent, respectively, of said source and D-well regions.

* * * * *